(12) United States Patent
Herzer et al.

(10) Patent No.: US 9,318,977 B2
(45) Date of Patent: Apr. 19, 2016

(54) ACTUATING CIRCUIT FOR THREE-LEVEL INVERTER

(71) Applicant: Semikron Elekktronik GmbH & Co., KG, Nürnberg (DE)

(72) Inventors: Reinhard Herzer, Illmenau (DE); Bastian Vogler, Fürth (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/536,285

(22) Filed: Nov. 7, 2014

(65) Prior Publication Data

US 2015/0188452 A1 Jul. 2, 2015

(30) Foreign Application Priority Data

Nov. 7, 2013 (DE) .......................... 10 2013 112 262

(51) Int. Cl.
*H02M 7/537* (2006.01)
*H02M 7/487* (2007.01)
(Continued)

(52) U.S. Cl.
CPC .............. *H02M 7/537* (2013.01); *H02M 7/487* (2013.01); *H03K 17/689* (2013.01); *H03K 17/6871* (2013.01); *H03K 2217/0063* (2013.01); *H03K 2217/0081* (2013.01)

(58) Field of Classification Search
CPC ... H02M 7/5387; H02M 7/487; H02M 7/537; H03K 17/6871; H03K 17/68; H03K 2217/0081; H03K 2217/0063
USPC .......................... 363/131, 132, 56.2, 56.3, 98
See application file for complete search history.

(56) References Cited

U.S. PATENT DOCUMENTS 6,268,841 B1 * 7/2001 Cairns et al. ..................... 345/98
6,337,804 B1 * 1/2002 Kea et al. ...................... 363/132
(Continued)

FOREIGN PATENT DOCUMENTS

DE         101 52 930 A1    10/2002
DE    10 2006 037 336 A1     2/2008
(Continued)

OTHER PUBLICATIONS

DE 102012220213 Patent Translation Powered by EPO Document, pp. 7-8 are Pertinent Pages.*
(Continued)

*Primary Examiner* — Jessica Han
*Assistant Examiner* — Demetries A Gibson
(74) *Attorney, Agent, or Firm* — The Law Offices of Roger S. Thompson

(57) ABSTRACT

An actuating circuit having a primary-side circuit part with an actuating logic circuit and a primary-side reference potential, and four secondary-side circuit parts each having one driver stage designed for actuating a phase of a three-level inverter and a first to fourth semiconductor switch, wherein each semiconductor switch and the secondary-side circuit part assigned thereto has a respective first to fourth secondary-side reference potential, and wherein in each case a level shifter connects the primary-side circuit part to the respective secondary-side circuit part and thus is assigned in each case to both circuit parts. In this connection, the primary-side reference potential corresponds to the first secondary-side reference potential. Furthermore, at least the actuating logic circuit, the first and second level shifters and the first and second driver stages are monolithically integrated.

13 Claims, 3 Drawing Sheets

(51) Int. Cl.
*H03K 17/687* (2006.01)
*H03K 17/689* (2006.01)

(56) References Cited

U.S. PATENT DOCUMENTS

| | | | |
|---|---|---|---|
| 6,452,365 B1 | 9/2002 | Majumdar | |
| 7,417,880 B2* | 8/2008 | Pawel et al. | 363/132 |
| 7,626,441 B2 | 12/2009 | Herzer | |
| 7,701,278 B2 | 4/2010 | Herzer | |
| 2003/0112040 A1* | 6/2003 | Yoshimura | 327/110 |
| 2006/0050455 A1 | 3/2006 | Sumida | |
| 2008/0106484 A1* | 5/2008 | Navarro et al. | 343/878 |
| 2011/0058399 A1 | 3/2011 | Honsberg | |
| 2011/0305043 A1* | 12/2011 | Matsumoto | 363/21.01 |
| 2011/0305343 A1* | 12/2011 | Lee et al. | 381/22 |
| 2012/0257430 A1* | 10/2012 | Truettner | 363/131 |
| 2014/0373632 A1* | 12/2014 | Ferraro et al. | 73/658 |
| 2015/0092467 A1* | 4/2015 | Nagarajan | 363/132 |

FOREIGN PATENT DOCUMENTS

| | | |
|---|---|---|
| DE | 10 2006 050 913 | 5/2008 |
| DE | 10 2007 006 319 | 8/2008 |
| DE | 10 2012 220 213 B3 * | 5/2014 |
| WO | WO 2013/007788 A1 | 1/2003 |

OTHER PUBLICATIONS

Schweizer M. et al: 11 Design and Implementation of a Highly Efficient Three-Level T-Type Converter for Low-Voltage Applications, Feb. 13, 2013, pp. 899-907, IEEE Power Electronics. Bd. 28. Nr. 2.

* cited by examiner

ACTUATING CIRCUIT FOR THREE-LEVEL INVERTER

BACKGROUND OF THE INVENTION

1. Field of the Invention

The invention relates to an actuating circuit for a three-level inverter.

2. Description of the Related Art

The invention is directed to an actuating circuit having a plurality of level shifters for transmitting actuation signals from an actuating logic circuit with a first reference potential to driver stages with at least partially different further reference potentials. In principle, such actuation circuits are required in power electronics systems to actuate semiconductor switches which are arranged as individual switches or in a bridge circuit. Such bridge circuits are known as single-phase, two-phase or three-phase bridge circuits, wherein the single-phase so-called half-bridge circuit is a basic component of a multiplicity of power electronics circuits. In a two-level half-bridge circuit, two semiconductor switches—a first, lower, so-called BOT switch and a second, upper, so-called TOP switch—are arranged in a manner connected in a series circuit. Such a half-bridge generally has a connection to a DC voltage intermediate circuit. The output, designed as AC voltage connection of the half-bridge is usually connected to a load according to the state of the art.

By alternately switching TOP and BOT switches, the output voltage of the half-bridge circuit varies between the fixed voltage values of the positive and negative voltage connections to the intermediate circuit. Since two static voltage states thus exist, this half-bridge circuit is referred to as two-level half-bridge circuit or two-level inverter.

In addition to the two-level half-bridge circuit, more complex bridge circuits are also known, to which three or more static voltage states can be switched. These are referred to as multi-level inverters. The advantage of multi-level inverters is that the profile of the output voltage can be approximated more closely to the desired sinusoidal profile. In this way, the total harmonic distortion (THD) of the output current can be reduced, as a result of which smaller and more inexpensive grid filters can be used. By the same token, the same THD values can be achieved at a lower switching frequency by use of multi-level inverters over two-level inverters, as a result of which lower switching losses occur. However, the increased expenditure for closed-loop control and the higher number of necessary components and actuating circuits are disadvantageous in the case of multi-level inverters.

The simplest configuration of a multi-level inverter is the three-level inverter with three switchable voltage states. In principle, two topologies are known for three-level inverters, the common feature of which is that, according to the state of the art, they are usually supplied by two series-connected high-voltage intermediate circuits via a positive and a negative connection. The center point of the series circuit is referred to as the neutral node and is usually at ground potential according to the state of the art. The neutral node is also used as the third voltage state.

According to the state of the art, actuating circuits for three-level inverters are usually embodied with galvanic isolation between a primary side and a plurality of secondary sides. The actuating circuit in this case consists of a plurality of partial circuits or functional blocks. The actuation signals of a superordinate control logic circuit, for example a microcontroller, are processed in a first primary-side circuit part of the actuating logic circuit. The reference potential of the primary-side circuit part is in this case at the grounded neutral node. The transmission of the actuation signals to the secondary-side circuit parts takes place in an electrically isolated manner via impulse transmitters which operate by transformer action or optically via optocouplers or optical waveguides. The driver stages as part of the secondary-side circuit part control the semiconductor switches, for example IGBTs, according to the transmitted signals.

In principle, all of the primary-side and the respective secondary-side functions can be brought together in monolithically integrated circuits. However, according to the state of the art, the required galvanically isolating potential isolation members are not integrable, with the result that the functional blocks of the primary-side circuit part and the secondary-side circuit part are usually constructed discretely together with the potential isolation member on a PCB (printed circuit board).

For two-level inverters, actuating circuits with potential isolation in integrated circuit technology, for example in a high-voltage integrated circuit (HVIC), are known in principle. HVICs are increasingly used since they offer certain advantages, such as low volume, low price and long service life. In this case, HVICs firstly offer the opportunity to realize the potential isolation between the primary-side actuating circuit and the secondary-side driver circuit, and secondly to integrate a level shifter with a high-voltage component having a breakdown voltage of the HVIC corresponding to the potential difference, which can be used to transmit signals between the primary-side and the secondary-side circuit part.

A level shifter of this type can be embodied as part of the actuating circuit and integrated in the HVIC. It is used to transmit a signal from a primary-side circuit part with a defined reference potential to a secondary-side circuit part with a temporarily higher or lower reference potential.

Furthermore, in principle, two isolation technologies are known for forming HVICs: firstly, the SOI (silicon on insulator) technologies, and secondly p-n-isolated technologies (junction isolation). SOI technology offers a dielectric potential isolation of components or groups of components, but is only available at present up to 800 V potential difference owing to the limited dielectric strength. In the case of p-n-isolated technologies, the potential difference of a reverse-biased p-n junction is incorporated. At present, this technology is available up to 1200 V potential difference.

A simple configuration of a level shifter consists of a high-voltage transistor (HV transistor) with the blocking ability which corresponds to the potential difference to be bridged and a resistor connected in series. If a signal is passed to the gate of the HV transistor on the primary-side circuit part, the HV transistor switches on. The transverse current thus generated through the level shifter causes a voltage drop across the resistor, which voltage drop can be detected as a signal by an evaluation circuit on the secondary-side circuit part. Such level shifters with HV transistors comprise, in principle, a transverse current path necessary for signal transmission, with the result that a potential isolation but no galvanic isolation is present.

German published patent application DE 101 52 930 A1 discloses an extended level shifter topology in which the actuation signal is transmitted in steps via intermediate potentials by means of a plurality of identical cascade-connected level shifters. Hence, transistors which only have a fraction of the required blocking ability of the overall level shifter can be used. Thus, the blocking ability of the level shifter can be significantly increased.

German published patent application DE 10 2006 037 336 A1 discloses a level shifter embodied as a series circuit composed of HV transistors of the n-channel type. This topology has the advantages that, in contrast to that according to DE 101 52 930 A1, firstly the power consumption and secondly the switching expenditure are reduced. This results, in particular, in a lower requirement on space.

It is a common feature of all of the mentioned configurations of HVICs that, in the case of complementary construction of the level shifter, a signal transmission from a circuit part with a high reference potential to a circuit part with a low reference potential is possible in principle. This property can thus be used for a reverse signal transmission from the secondary-side circuit part to the primary-side circuit part and thus for the actuating logic circuit there. However, an HV transistor of the p-channel type is required for this purpose.

Parasitic inductances of a system composed of a power semiconductor module and an actuating circuit may result in severe chopping of the respective reference potential of the secondary-side circuit parts, usually in the positive direction but also negative direction, below the actuation-side reference potential during rapid switching of the power switches. This occurs particularly severely in medium- and high-power systems, in which large currents, in particular currents greater than 50 A, are switched. However, most level shifters which are currently available are not configured for signal transmission of this type in the negative direction. Also, the known p-n isolation technologies have the disadvantage that, in the case of a corresponding chopping of the reference potential in the negative direction, the blocking ability between the primary-side and the secondary-side circuit part is lost and the flowing leakage current can lead to parasitic thyristor structures being triggered, so-called latch-up. This leads to a loss of function and, possibly, to destruction of the circuits in question.

Circuits utilizing SOI technologies do not suffer from these drawbacks, owing to the dielectric isolation and the bidirectional blocking ability connected therewith of the isolation regions, with the result that transmission circuits which ensure a reliable signal transmission and isolation are realizable in terms of circuitry, even in the event of temporary or permanent negative secondary-side reference potential. German published patent application DE 10 2006 050 913 A1 discloses such a level shifter for a BOT secondary-side embodied in SOI technology with in each case an UP and DOWN level shifter branch, while German published patent application DE 10 2007 006 319 A1 discloses such a level shifter for a TOP secondary-side likewise embodied in SOI technology as UP and DOWN level shifter branch.

SUMMARY OF THE INVENTION

The object of the invention is to provide an improved actuating circuit for actuating three-level inverters.

The invention is at least partially directed to addressing the problem of suggesting an actuating circuit for actuating three-level inverters with symmetrically supplied intermediate circuit in the form of an at least partially monolithically integrated circuit which can be constructed in a housing or on a substrate, in particular on a conductor track of a metalized ceramic substrate of a power semiconductor module.

The invention relates to an actuating circuit having a primary-side circuit part with an actuating logic circuit and a primary-side reference potential and four secondary-side circuit parts with in each case one driver stage designed for actuating a phase of a three-level inverter with in each case a first to fourth semiconductor switch, wherein each semiconductor switch and the secondary-side circuit part assigned thereto has an assigned first to fourth secondary-side reference potential, wherein two secondary-side reference potentials may indeed be identical. In this connection, in each case a level shifter connects the primary-side circuit part to the respective secondary-side circuit part and thus is assigned in each case to both circuit parts. In the case of this actuating circuit, the primary-side reference potential corresponds to the first secondary-side reference potential, that is to say the two reference potentials are identical. Furthermore, at least the actuating logic circuit, the first and second level shifters and the first and second driver stages are monolithically integrated in an HVIC. Monolithic integration, including the mentioned below, is preferably done in SOI technology.

It may be advantageous if the semiconductor switches of the three-level inverter are connected in series or in T-type topology and if, in this connection, the first semiconductor switch is connected to a negative voltage connection and the fourth semiconductor switch is connected to a positive voltage connection of the three-level inverter.

It is particularly preferred if the actuating logic circuit and all of the level shifters and all of the driver stages are monolithically integrated.

Alternatively, the third and fourth level shifters may also be formed from in each case two partial level shifters, wherein the respective first partial level shifter is monolithically integrated together with the actuating logic circuit and the first and second level shifters and the first and second driver stages on a first HVIC, and wherein the respective second partial level shifter is monolithically integrated with the assigned driver stage on a separate second or third HVIC.

In this connection, the first, second and third HVICs can be built into a multi-chip module with common housing, or each HVIC can be arranged on a conductor track which is electrically isolated with respect to the other conductor tracks of a power semiconductor module.

In the actuating circuit, at least one level shifter can be designed to transmit one actuation signal from the primary-side circuit part to the assigned secondary-side circuit part in a unidirectional manner, or is designed to transmit an actuation signal and a return signal and thus to provide bidirectional transmission.

Advantageously, a semiconductor switch is formed from at least one power transistor, in particular an IGBT with a free-wheeling diode connected back-to-back in parallel therewith, wherein the potential of the emitter of the IGBT is the reference potential thereof.

It goes without saying that the different configurations of the invention can be realized individually or in any combinations which are not mutually exclusive per se, in order to achieve improvements. In particular, the features mentioned and explained above, independently of whether they are mentioned within the scope of the method or of the object, can be used not only in the specified combinations but also in other combinations or on their own without departing from the scope of the present invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
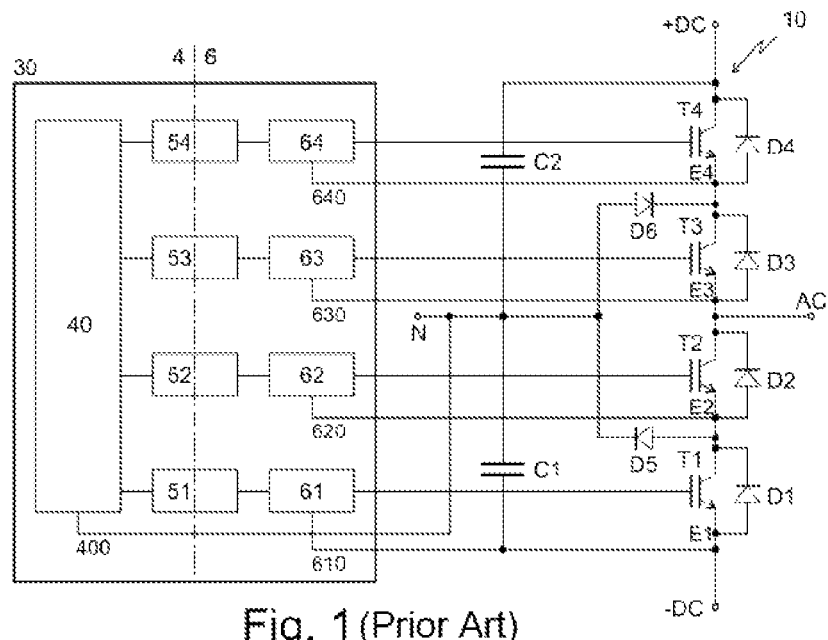
FIG. 1 shows a prior art actuating circuit for a three-level inverter having a first topology.

FIG. 1 shows a first topology of a prior art three-level inverter 10. Inverter 10 includes an associated actuating circuit 30 with transmitters 51 to 54 for electrical potential isolation between a primary-side circuit part 4 and four secondary-side circuit parts 6. Three-level inverter 10 consists of the series circuit composed of four semiconductor switches to be actuated, in this case each designed as IGBTs T1 to T4 with associated freewheeling diodes D1 to D4 connected back-to-back in parallel and with two limiting diodes D5, D6. Three-level inverter 10 is supplied by two series-connected identical high-voltage intermediate circuit capacitors C1, C2, with a positive voltage connection +DC and a negative voltage connection -DC.

The common connection of the intermediate circuit capacitors is referred to as neutral node N and is generally grounded. Second limiting diode D6 limits the voltage at the emitter E3 of third IGBT T3 and hence also the voltage at the AC voltage connection AC such that only values between those of neutral node N and positive voltage connection +DC can be present. First limiting diode D5 limits the voltage at the emitter E2 of the second IGBT T2 and hence also the voltage at the AC voltage connection AC such that only values between those of negative voltage connection -DC and neutral node N can be present. Owing to his limiting of voltages at neutral node N, the topology is referred to as NPC (neutral point clamped) topology. Three-level inverters 10 in NPC topology have the advantage that, in order to achieve the desired dielectric strength, components having a lower breakdown voltage than the total intermediate circuit voltage can be used. By way of example, components of the voltage class 600 V can be used for a three-level inverter of the voltage class 1200 V.

Actuating circuit 30 consists of a plurality of partial circuits or functional blocks. The actuation signals from a superordinate circuit—not shown—are processed in actuating logic circuit 40 of primary-side circuit part 4. The reference potential 400 of the actuating logic circuit 40 is in this case at the grounded neutral node N. The actuating signals are transmitted by galvanically isolating potential isolation members, in this case transmitters 51 to 54, to the respective secondary-side circuit parts 6. Driver stages 61 to 64 of the respective secondary-side circuit parts 6 actuate the IGBTs T1 to T4 according to the transmitted actuation signals. In this case, each reference potentials 610, 620, 630, 640 of driver stages 61 to 64, respectively, is connected to the respective emitter E1 to E4 of the respective IGBTs T1 to T4 to be actuated. According to the state of the art, the functional blocks of actuating circuit 30 are discretely constructed on a printed circuit board.

Figure 2:
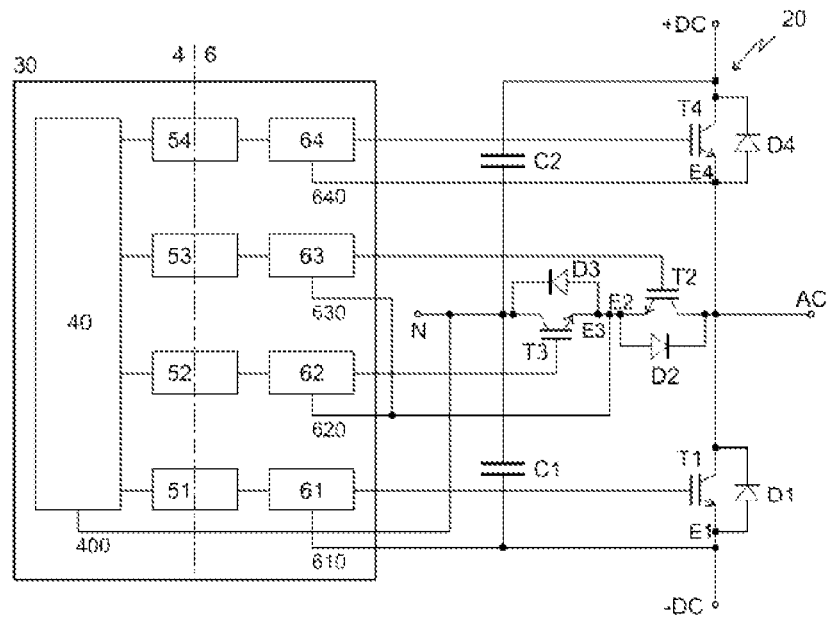
FIG. 2 shows a prior art actuating circuit for a three-level inverter having a second topology.

FIG. 2 shows a second topology of a prior art three-level inverter 20 with an associated actuating circuit 30 which, in principle, is configured analogously to FIG. 1. Three-level inverter 20 consists of a half-bridge circuit of the first and fourth semiconductor switches, in each case designed as IGBTs T1, T4 with associated freewheeling diodes D1, D4, and a series circuit composed of the second and third semiconductor switches between the AC voltage connection AC and the neutral node N, wherein the emitters E2, E3 of IGBTs T2, T3 of the second and third semiconductor switches are connected to one another. Three-level inverter 20 is likewise supplied by two series-connected identical high-voltage intermediate circuit capacitors C1, C2 with the positive voltage connection +DC and the negative voltage connection -DC. The common connection of the intermediate circuit capacitors, the neutral node N, is generally grounded. If second IGBT T2 is switched on, the voltage at the AC voltage connection AC is limited by third diode D3 such that only values between those of the neutral node N and of the positive voltage connection +DC can be present. If third IGBT T3 is switched on, in an analogous manner, the voltage at the AC voltage connection AC is limited by second diode D2 such that only values between those of the negative voltage connection -DC and of the neutral node N can be present. In this case, a topology with limiting the voltages at neutral node N is also present. Owing to the T-shaped circuit diagram thereof, it is referred to as TNPC (T-type neutral point clamped) topology. Three-level inverters 20 in TNPC topology have the advantage over three-level inverters in NPC topology—cf. FIG. 1—that the additional limiting diodes D5, D6 are not necessary. However, it is disadvantageous that, in order to achieve the desired dielectric strength, components having a breakdown voltage which is equal to or, preferably, slightly greater than, that of the overall intermediate circuit voltage must be used for the first and fourth power switches T1, D1, T4, D4. By way of example, for a three-level inverter of the voltage class 1200 V, components of the voltage class 1200 V, wherein this is usually a slightly higher dielectric strength according to the state of the art, must also be used.

To actuate three-level inverters 20 in TNPC topology, an actuating circuit 30 is used, like for actuating three-level inverters 10 in NPC topology according to FIG. 1. However, the reference potentials 620, 630 of the second and third secondary-side circuit parts 62, 63 are connected to the same potential, that of the emitters E2, E3 of the second and third IGBTs T2, T3.

Figure 3:
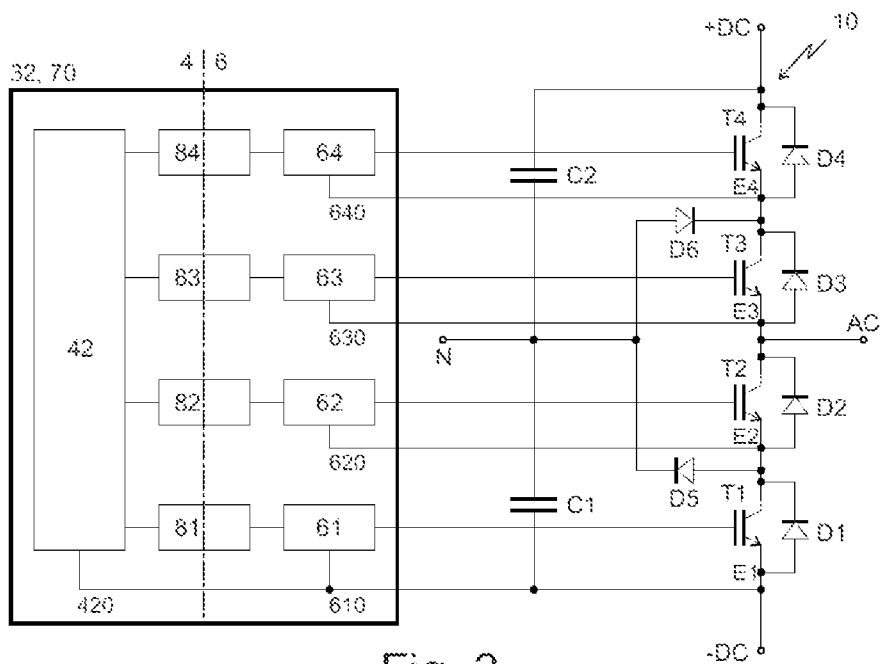
FIG. 3 shows an actuating circuit according to the invention for a three-level inverter with a first topology.

FIG. 3 shows an actuating circuit 32 according to the invention for actuating a three-level inverter 10 in first, that is to say in NPC, topology with a symmetrically grounded intermediate circuit. Actuating circuit 32 according to the invention with a primary-side circuit part 4 and four secondary-side circuit parts 6 is realized using integrated circuit technology in an HVIC (high-voltage integrated circuit) 70 and thus also comprises the potential isolation in a single monolithically integrated circuit. The potential-isolated transmission of the actuating signals from the primary-side circuit part 4 with actuating logic circuit 42 to the respective secondary-side circuit parts 6 with driver stages 61 to 64 takes place by means of level shifters 81 to 84. The possible integration of the overall actuating circuit 32 for three-level inverters 10 in a housing, by way of example a standard IC housing with corresponding isolation distances of the pins, forms a significant part of the advancement of the invention over the state of the art as exemplified in FIGS. 1 and 2. The possibility of arranging HVIC 70 directly on a conductor track of a metalized ceramic substrate of a three-level power semiconductor module is likewise advantageous, as a result of which it is possible to electrically connect three-level inverter 10 and actuating circuit 32 directly in the power semiconductor module.

In the case of actuating circuit 32 according to the invention, primary-side reference potential 420 is associated with the lowest potential of the overall circuit arrangement, that is to say with negative voltage connection −DC or in other words with the reference potential of the first semiconductor switch, formed by first transistor T1.

Proceeding from this reference potential, that is to say that potential of the negative voltage connection -DC, the following potential differences between the primary-side circuit part 4 and secondary-side circuit parts 6 must be overcome by level shifters 81 to 84 in order to actuate IGBTs T1 to T4 of three-level inverter 10 in NPC topology in a potential-isolated manner:

The reference potential 610 of first driver stage 61 is the emitter potential of the first IGBT T1 and hence also the primary-side reference potential 420. Thus, in this case, signal transmission via a high-voltage level shifter is not absolutely necessary. By virtue of system-internal inductances, for example line inductances in the power semiconductor module of three-level inverter 10 or in the feed line to actuating circuit 32, it is possible, however, for there to be severe chopping of the emitter potential of the first IGBT T1 in the positive or negative direction during switching of the semiconductor switch. This is particularly severe in medium- and high-power semiconductor systems, in which large currents, for example greater than 50 A, are switched. Owing to the arising potential difference, an MV (medium voltage) level shifter 81 with a dielectric strength of 20 V to 30 V, for example, in particular with UP and DOWN characteristic, is sufficient for reliable signal transmission.

Reference potential 620 of second driver stage 62 is the emitter potential of second IGBT T2, which varies between the potential of the negative voltage connection −DC and of neutral node N. The dielectric strength of second level shifter 82 must accordingly likewise be at least slightly higher than the voltage which is present across first intermediate circuit capacitor C1.

Reference potential 630 of third driver stage 63 is the emitter potential of third IGBT T3 and hence the AC voltage connection AC of three-level inverter 10, which varies between that potential of the negative −DC and positive +DC voltage connections. The dielectric strength of third level shifter 83 must accordingly likewise be at least slightly higher than the overall voltage which is present across the two intermediate circuit capacitors C1, C2.

The reference potential 640 of fourth driver stage 64 is the emitter potential of fourth IGBT T4, which varies between that potential of neutral node N and positive voltage connection +DC. The dielectric strength of fourth level shifter 84 must accordingly likewise be at least slightly higher than the overall voltage which is present across the two intermediate circuit capacitors C1, C2.

Figure 4:
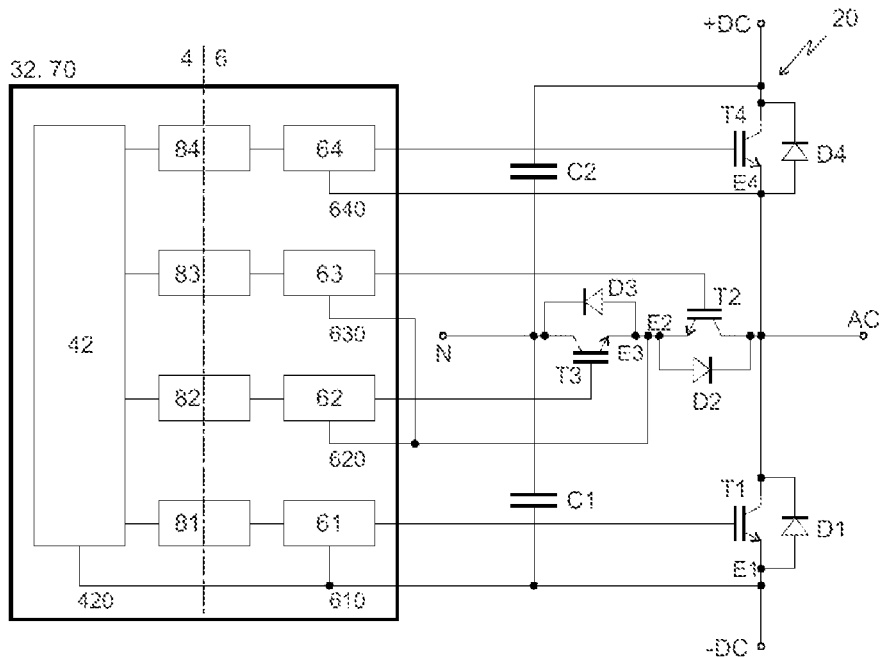
FIG. 4 shows an actuating circuit according to the invention for a three-level inverter with second topology.

FIG. 4 shows actuating circuit 32 according to the invention for actuating a three-level inverter 20 in second, that is to say in TNPC, topology with a symmetrically grounded intermediate circuit.

Proceeding from the same reference potential as in FIG. 3, that is to say that potential of the negative −DC, different configurations are described below only in comparison with FIG. 3:

In the case of three-level inverter 20 in TNPC topology emitters E2, E3 of second and third IGBTs T2, T3, respectively, are connected to one another and thus have the same reference potential 620, 630 which varies between the potentials of negative voltage connection −DC and of neutral node N. The dielectric strength of second and third level shifters 82, 83 must accordingly be at least slightly higher than the voltage which is present at the first intermediate circuit capacitor C1.

Figure 5:
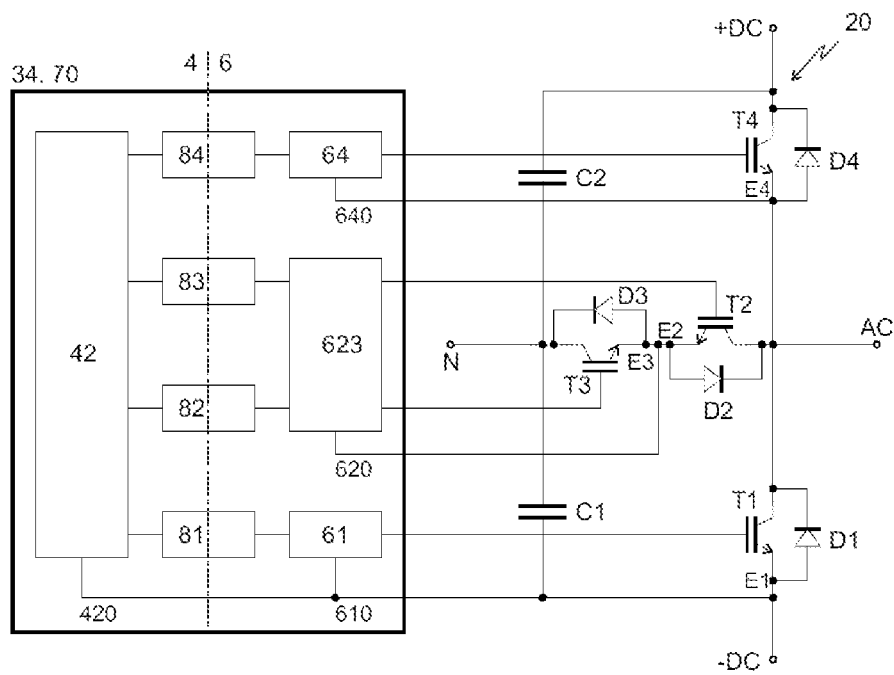
FIG. 5 shows a variation of the actuating circuit shown in FIG. 4.

FIG. 5 shows an actuating circuit 34 which is modified in comparison with that according to FIG. 4. Since in the case of three-level converters 20 in TNPC topology, emitters E2, E3 of second and third IGBTs T2, T3, respectively, are connected to one another and thus have the same reference potential 620, 630, second and third driver stages 62, 63 can be combined to form a common driver stage 623.

If the dielectric strength of the monolithically integrable high-voltage components and hence, in particular, the HV level shifters is lower than the overall voltage which is present across the two intermediate circuit capacitors C1, C2, an extended level shifter topology, embodied as a series circuit composed of HV transistors, can be used to achieve the required dielectric strength. Since, in most cases, the breakdown voltage of the isolation of the HVIC technology and that of the HV transistors are approximately equal, the dielectric strength of the overall level shifter arrangement can only be increased by one factor if each of the HV transistors is arranged on a separate substrate which is isolated from the others.

Figure 6:
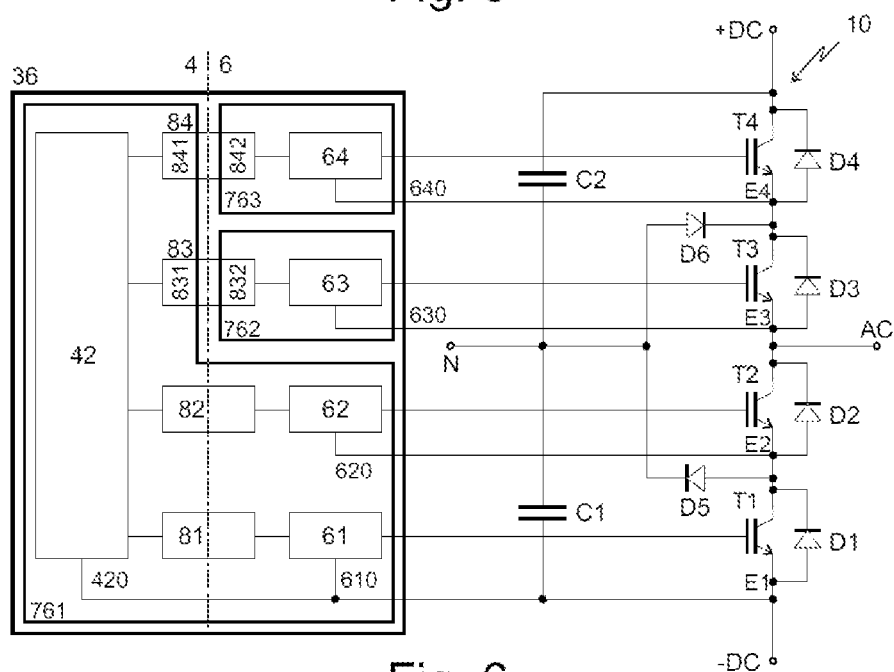
FIG. 6 shows a further actuating circuit according to the invention.

FIG. 6 shows another actuating circuit 36 according to the invention for actuating three-level inverters 10, in particular in NPC topology, for a voltage class in this case 1200 V, for example, which voltage class is greater than that of the available HVIC technology, in this case 600 V, for example. By virtue of the use of the extended level shifter topology with the series circuit composed of in each case two partial level shifters 831, 832 and 841, 842, the required dielectric strength of 1200 V for actuating the third and fourth IGBTs T3, T4 can be achieved. In this case, the actuating circuit consists of three HVICs, wherein a first HVIC 761 has the actuating circuit 42, first and second level shifters 81, 82 and first and second driver stages 61, 62 and two partial level shifters 831, 841 which in each case form a part of the third or fourth level shifter 83, 84. In this connection, second level shifter 82 has a dielectric strength of 600 V, for example. The second and the third HVICs 761, 762 have in each case second partial level shifters 832, 842 of third and fourth level shifters 83, 84. The respective partial level shifters 831, 832, 841, 842 likewise have a dielectric strength of 600 V, for example. The HVICs 761, 762, 763 can be arranged in a modified standard IC housing, a so-called multi-chip module, on islands which are isolated from one another. The electrical connection between the individual chips can be achieved by means of a wire bonding method. It is also possible to construct the respective HVICs 761, 762, 763 on conductor tracks, which are isolated from one another, of a metalized ceramic substrate of a three-level power semiconductor module.

In principle, actuating circuit 36 can also be used for three-level inverters 20 in TNPC topology, wherein optionally only two HVICs are necessary.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An actuating circuit comprising: a primary-side circuit part having an actuating logic circuit and a primary-side reference potential; at least one three level inverter having a negative voltage connection; a first secondary-side circuit part having a first driver stage for actuating a phase of one of said at least one three-level inverters, and a first semiconductor switch, each of said first secondary-side circuit part and said first semiconductor switch having a first secondary-side reference potential; a first level shifter connected to said primary-side circuit part and to said first secondary-side circuit part; a second secondary-side circuit part having a second driver stage for actuating a phase of one of said at least one three-level inverters, and a second semiconductor switch, each of said second secondary-side circuit part and said second semiconductor switch having a second secondary-side reference potential;
a second level shifter connected to said primary-side circuit part and to said second secondary-side circuit part; a third secondary-side circuit part having a third driver stage for actuating a phase of one of said at least one three-level inverters, and a third semiconductor switch, each of said third secondary-side circuit part and said third semiconductor switch having a third secondary-side reference potential; a third level shifter connected to said primary-side circuit part and to said third secondary-side circuit part; a fourth secondary-side circuit part having a fourth driver stage for actuating a phase of one of said at least one three-level inverters, and a fourth semiconductor switch, each of said fourth secondary-side circuit part and said fourth semiconductor switch having a fourth secondary-side reference potential; and a fourth level shifter connected to said primary-side circuit part and to said fourth secondary-side circuit part;
wherein said primary-side reference potential corresponds to said first secondary-side reference potential and is directly connected to said negative voltage connection of said three-level-inverter; and wherein at least said actuating logic circuit, said first and second level shifters and said first and second driver stages are monolithically integrated in a first HVIC.

2. The actuating circuit of claim 1,
wherein said semiconductor switches are connected in one of series and T-type topology; and
wherein said first semiconductor switch is connected to a negative voltage connection of said three-level inverter and said fourth semiconductor switch is connected to a positive voltage connection of said three-level inverter.

3. The actuating circuit of claim 2, wherein said actuating circuit; said first, second, third and fourth level shifters and said first, second, third and fourth driver stages are monolithically integrated.

4. The actuating circuit of claim 1, wherein said actuating circuit; said first, second, third and fourth level shifters and said first, second, third and fourth driver stages are monolithically integrated.

5. An actuating circuit, comprising: a primary-side circuit part having an actuating logic circuit and a primary-side reference potential; at least one three level inverter; a first secondary-side circuit part having a first driver stage for actuating a phase of one of said at least one three-level inverters, and a first semiconductor switch, each of said first secondary-side circuit part and said first semiconductor switch having a first secondary-side reference potential;
a first level shifter connected to said primary-side circuit part and to said first secondary-side circuit part; a second secondary-side circuit part having a second driver stage for actuating a phase of one of said at least one three-level inverters, and a second semiconductor switch, each of said second secondary-side circuit part and said second semiconductor switch having a second secondary-side reference potential; a second level shifter connected to said primary-side circuit part and to said second secondary-side circuit part; a third secondary-side circuit part having a third driver stage for actuating a phase of one of said at least one three-level inverters, and a third semiconductor switch, each of said third secondary-side circuit part and said third semiconductor switch having a third secondary-side reference potential; a third level shifter connected to said primary-side circuit part and to said third secondary-side circuit part; a fourth secondary-side circuit part having a fourth driver stage for actuating a phase of one of said at least one three-level inverters, and a fourth semiconductor switch, each of said fourth secondary-side circuit part and said fourth semiconductor switch having a fourth secondary-side reference potential; and a fourth level shifter connected to said primary-side circuit part and to said fourth secondary-side circuit part; wherein said primary-side reference potential corresponds to said first secondary-side reference potential; wherein at least said actuating logic circuit, said first and second level shifters and said first and second driver stages are monolithically integrated in a first HVIC;
wherein said third and fourth level shifters each have respective first and second partial level shifters; wherein said first partial level shifters of said third and fourth level shifters are monolithically integrated together with said actuating logic circuit, said first and second level shifters and said first and second driver stages on a second HVIC; and wherein said second partial level shifters of said third and fourth level shifters are monolithically integrated with said third and fourth driver stages in a third HVIC, separate from said second HVIC.

6. The actuating circuit of claim 5, wherein said first, second and third HVICs are built into a multi-chip module with a common housing.

7. The actuating circuit of claim 5, wherein said second and third HVICs are employed in a power semiconductor module having conductor tracks and each HVIC is disposed on a conductor track which is electrically isolated with respect to the other conductor tracks on which one of said HVICs is disposed.

8. The actuating circuit of claim 1, wherein at least one level shifter transmits one actuation signal from said primary-side circuit part to its respective secondary-side circuit part unidirectionally.

9. The actuating circuit of claim 1, wherein at least one level shifter transmits one actuation signal from said primary-side circuit part to its respective secondary-side circuit part, and a return signal therefrom, and thus provides bidirectional transmission.

10. The actuating circuit of claim 1 wherein at least one of said semiconductor switches is formed from at least one power transistor.

11. The actuating circuit of claim 10 wherein said at least one power transistor includes an IGBT with a freewheeling diode connected back-to-back in parallel therewith.

12. The actuating circuit of claim 11, wherein said power transistor includes an emitter at the reference potential of the respective IGBT.

13. The actuating circuit of claim 1, wherein the monolithic integration is done in SOI technology.

\* \* \* \* \*